(12) United States Patent
Maruyama et al.

(10) Patent No.: US 7,736,741 B2
(45) Date of Patent: Jun. 15, 2010

(54) SINGLE-WALL CARBON NANOTUBE HETEROJUNCTION

(75) Inventors: Ryuchiro Maruyama, Kanagawa (JP); Toshinori Iwai, Kanagawa (JP); Hisashi Kajiura, Kanagawa (JP); Koji Kadono, Tokyo (JP); Kenichi Kurihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 14 days.

(21) Appl. No.: 11/862,587

(22) Filed: Sep. 27, 2007

(65) Prior Publication Data

US 2008/0102017 A1 May 1, 2008

(30) Foreign Application Priority Data

Oct. 26, 2006 (JP) .......................... P2006-291065

(51) Int. Cl.
*B32B 9/00* (2006.01)
(52) U.S. Cl. .................... 428/408; 977/742; 423/447.1
(58) Field of Classification Search ................. 428/408; 423/447.1, 447.2, 447.4; 977/742
See application file for complete search history.

(56) References Cited

U.S. PATENT DOCUMENTS

| | | | |
|---|---|---|---|
| 6,280,677 B1* | 8/2001 | Yakobson | 264/430 |
| 6,280,877 B1 | 8/2001 | Urry | |
| 6,283,812 B1* | 9/2001 | Jin et al. | 445/24 |
| 6,331,209 B1* | 12/2001 | Jang et al. | 117/90 |

2002/0164509 A1 11/2002 Wheat et al.

FOREIGN PATENT DOCUMENTS

JP 2002-343389 11/2002

OTHER PUBLICATIONS

T. Durkop, S.A. Getty, E. Cobas, and M.S. Fuhrer, Extraordinary Mobility in Semiconducting Carbon Nanotubes, Nano Letters, 2004 vol. 4, No. 1, 35-39.
M. Shiraishi, T. Takenobu, A. Yamada, M. Ata, H. Kataura, Hydrogen Storage in Single-Walled Carbon Nanotube Bundles and Peapods, Chemical Physics Letters, 358, 2002, 213-218.
J.-F. Colomer, C. Stephan, S. Lefrant, G. Van Tendeloo, I. Willems, Z. Konya, A. Fonseca, C. Laurent, J.B. Nagy, Large-scale Synthesis of Single-wall Carbon Nanotubes by Catalytic Chemical Vapor Deposition (CCVD) Method, Chemical Physics Letters, 317. 2000, 83-89.
J.-F. Colomer, J.-M. Benoit, C. Stephan, S. Lefrant, G. Van Tendeloo, J.B. Nagy, Characterization of Single-wall Carbon Nanotubes Produced by CCVD Method,Chemical Physics Letters, 345, 2001, 11-17.
S. Tang, Z. Zhong, Z. Xiong, L. Sun, L. Liu, J. Lin, Z.X. Shen, K.L. Tan, Controlled Growth of Single-walled Carbon Nanotubes by Catalytic Decomposition of CH4 Over Mo/Co/MgO Catalysts, Chemical Physics Letters, 350, 2001, 19-29.
K. Mukhopadhyay, A. Koshio, N. Tanaka, H. Shinohara, A Simple and Novel Way to Synthesize Aligned Nanotube Bundles at Low Temperature, Jpn. J. Appl. Phys. vol. 37, 1998, L1257-L1259.

(Continued)

*Primary Examiner*—David R Sample
*Assistant Examiner*—Daniel Miller
(74) *Attorney, Agent, or Firm*—K&L Gates, LLP

(57) ABSTRACT

A single-wall carbon nanotube heterojunction is provided. In the single-wall carbon nanotube, a semiconductive single-wall carbon nanotube and a metallic single-wall carbon nanotube are joined with each other in a longitudinal direction thereof.

6 Claims, 8 Drawing Sheets

OTHER PUBLICATIONS

K. Mukhopadhyay, A. Koshio, T. Sugai, N. Tanaka, H. Shinohara, Z. Konya, J.B. Nagy, Bulk Production of Quasi-aligned Carbon Nanotube Bundles by the Catalytic Chemical Vapour Deposition (CCVD) Method, Chemical Physics Letters, 303, 1999. 117-124.

S. Baik, M. Usrey, L. Rotkina, M. Strano, Using the Selective Functionalization of Metallic Single-walled Carbon Nanotubes to Control Dielectrophoretic Mobility, J. Phys. Chem. B, 2004, 108, 15560-15564.

M. Strano, M. Zheng, A. Jagota, G.B. Onoa, D. Heller, P. Barone, M. Usrey, Understanding the Nature of the DNA-Assisted Separation of Single-walled Carbon Nanotubes Using Fluorescence and Raman Spectroscopy, Nano Letters, 2004, vol. 4, No. 4, 543-550.

M. Strano, Probing Chiral Selective Reactions Using a Revised Kataura Plot for the Interpretation of Single-walled Carbon Nanotube Spectroscopy, JACS Articles, 125, 2003, 16148-16153.

M. Zheng, A. Jagota, M. Strano, A.P. Santos, P. Barone, S.G. Chou, B.A. Diner, M.S. Dresselhaus, R.S. McLean, G.B. Onoa, F.F. Samsonidze, E.D. Semke, M. Usrey, D.J. Walls, Structure-based Carbon Nanotube Sorting by Sequence-dependent DNA Assembly, Science, 302, 2003, 1545-1548.

R. Martel, T. Schmidt, H.R. Shea, T. Hertel, P. Avouris, Single- and Multi-wall Carbon Nanotube Field-effect Transistors, Applied Physics Letters, 73, 1998, 2447-2449.

M.S. Strano, C.A. Dyke, M.L. Usrey, P.W. Barone, M.J. Allen, H. Shan, C. Kittrell, R.H. Hauge, J.M. Tour, R.E. Smalley, Electronic Structure Control of Single-walled Carbon Nanotube Functionalization, Science, 301, 2003, 1519-1522.

Y. Li, D. Mann, M. Rolandi, W. Kim, A. Ural, S. Hung, A Javey, J. Cao, D. Wang, E. Yenilmez, Q. Wang, J.F. Gibbons, Y. Nishi, H. Dai, Preferential Growth of Semiconducting Single-walled Carbon Nanotubes by a Plasma Enhanced CVD Method, Nano Letters, vol. 4, No. 2, 2004, 317-321.

P.G. Collins, M.S. Arnold, P. Avouris, Engineering Carbon Nanotubes and Nanotube Circuits Using Electrical Breakdown, Science, 292, 2001, 706-709.

* cited by examiner

BOUNDARY

SINGLE-WALL CARBON NANOTUBE HETEROJUNCTION

CROSS-REFERENCES TO RELATED APPLICATIONS

The present application claims priority to Japanese Patent Application JP 2006-291065 filed in the Japanese Patent Office on Oct. 26, 2006, the entire contents of which is being incorporated herein by reference.

BACKGROUND

The present application relates to a single-wall carbon nanotube heterojunction and a method of manufacturing the same and a semiconductor device and a method of manufacturing the same and is suitably applied to, for example, a field effect transistor (FET) that uses a single-wall carbon nanotube as a channel material.

Since the single-wall carbon nanotube shows high mobility, it is expected that the single-wall carbon nanotube is applied as a channel material for a fast switching FET (see, for example, T. Durkop, S. A. Getty, Enrique Cobas, and M. S. Fuhrer, Nanolett., 4 (2004)35). In general, when an FET is manufactured using the single-wall carbon nanotube, a process for the manufacturing is roughly divided into two. One is a method of synthesizing a high purity single-wall carbon nanotube and, then, producing a single-wall carbon nanotube dispersed liquid and applying the single-wall carbon nanotube dispersed liquid to a predetermined position on a substrate. The other is a technique for arranging a catalyst in a predetermined position on a substrate, directly growing a single-wall carbon nanotube from this catalyst, and orienting the single-wall carbon nanotube. At present, since the latter on-board direct growth method has advantages that a single-wall carbon nanotube with high mobility can be obtained and the method is also applicable to a micro process, the method is studied by many researchers.

In recent years, it has become possible to synthesize a high purity single-wall carbon nanotube according to the chemical vapor deposition (CVD) method using Fe, Ni, and Co or alloy particulates containing these kinds of metal. It is becoming possible to control a radius of a single-wall carbon nanotube to some degree according to a laser abrasion method (see, for example, M. Shiraishi, T. Takenobu, A. Yamada, M. Ata, and H. Kataura, Chem. Phys. Lett., 358 (2002)213), zeolite supported catalyst having a uniform sub-nano-scale radius (see, for example, J.-F. Colomer, C. Stephan, S. Lefrant, G. V. Tendeloo, I. Willems, Z. Konya, A. Fonseca, Ch. Laurent, and J. B. Nagy, Chem. Phys. Lett. 317 (2000)83, J.-f. Colomer, J.-M. Benoit, C. Stephan, S. Lefrant, G. Van Tendeloo, and J. B. Nagy, Chem. Phys. Lett. 345 (2001)11, S. Tang, Z. Zhong, Z. Xiong, L. Sun, L. Liu, J. Lin, Z. X. Shen, and K. L. Tan, Chem. Phys. Lett. 350 (2001)19, K. Mukhopadhyay, A. Koshio, N. Tanaka, and H. Shinohara, Jpn. J. Appl. Phys. 37 (1998)L1257, and K. Mukhopadhyay, A. Koshio, T. Sugai, N. Tanaka, H. Shinohara, Z. Konya, J. B. Nagy, Chem. Phys Lett. 303 (1999)117), and a catalyst synthesizing technique that uses organic polymer containing metal as a precursor. A problem in an actual process for manufacturing an element based on an FET is deterioration in an element characteristic due to mixing of metallic single-wall carbon nanotubes in semiconductive single-wall carbon nanotubes. However, it is difficult to control, in a step of synthesizing single-wall carbon nanotubes, the semiconductive single-wall carbon nanotubes and the metallic single-wall carbon nanotubes with a very small difference (equal to or smaller than 0.01 nanometer) in tube diameters. Therefore, under the present situation, results of researches for a technique for separating the semiconductive single-wall carbon nanotubes and the metallic single-wall carbon nanotubes are extremely limited as described below.

Methods proposed to date in order to solve this problem include (1) separation of the semiconductive single-wall carbon nanotubes and the metallic single-wall carbon nanotubes by chemical treatment (see, for example, M. S. Strano, et al, JPC. B 108 (2004)15560, M. S. Strano, et al, Nano Lett. 4 (2004)543, M. S. Strano, et al, JACS. 125 (2003)16148, and M. S. Strano, et al, Science 302 (2003)1545), (2) electrical breakdown of the metallic single-wall carbon nanotubes (see, for example, R. Martel, T. Schmidt, H. R. Shea, T. Hertel, Ph. Avouris, Appl. Phys. Lett. 73 (1998)2447), and (3) insulation of the metallic single-wall carbon nanotubes by chemical modification. Among these methods, at present, (1) separation by chemical treatment is set as an ultimate technical target among subjects for realizing a semiconductor device employing the semiconductive single-wall carbon nanotubes. As this method of separation by post treatment of synthesizing, selective absorption to the metallic or semiconducting single-wall carbon nanotubes uses chemicals (see M. S. Strano, et al, Science 301 (2003)1519). However, no other remarkable results are reported. In the case of the chemical separation method, a high separation ratio is necessary in an actual operation of the FET. For example, to cause 90% or more of a single-wall carbon nanotube FET, in which five carbon nanotubes bridges a source electrode and a drain electrode, to operate, it is necessary to set an abundance ratio of the semiconductive single-wall carbon nanotubes to 98%. Judging from these examples of reports, under the present situation, a clear method for solving the deterioration in an FET characteristic due to mixing of the metallic single-wall carbon nanotubes in the semiconductive single-wall carbon nanotubes has not been established yet.

On the basis of an operation characteristic of a single-wall carbon nanotube FET employing single-wall carbon nanotubes synthesized at 600° C. according to a plasma enhanced chemical vapor deposition (PECVD) method using a catalyst produced from an Fe thin film and using a methane (CH4) gas as a carbon material, it is reported that about 90% of single-wall carbon nanotubes synthesized by the PECVD method are semiconductive single-wall carbon nanotubes (see Y. Li and H. Dai, et al, Nano Lett., 4, 2 (2004)317). However, in this report, there is no reference to a ground and a theory for the selective growth of the semiconductive single-wall carbon nanotubes at the abundance ratio of 90% by the PECVD method.

As described above, in the techniques in the past, it is difficult to prevent the deterioration in the characteristic of the single-wall carbon nanotube FET due to mixing of the metallic single-wall carbon nanotubes in the semiconductive single-wall carbon nanotubes.

SUMMARY

Therefore, it is desirable to provide a single-wall carbon nanotube heterojunction and a method of manufacturing the same and a semiconductor device employing the single-wall carbon nanotube heterojunction and a method of manufacturing the same that make it possible to fundamentally solve the problem of the deterioration in the characteristic of the single-wall carbon nanotube FET due to mixing of the metallic single-wall carbon nanotubes in the semiconductive single-wall carbon nanotubes and realize a single-wall carbon nanotube FET having satisfactory characteristics such as an on/off ratio.

As a result of intensive study, the inventors have found that, in the process of manufacturing the single-wall carbon nanotube FET, as a method of preventing the influence of mixing of the metallic single-wall carbon nanotubes in the semiconductive single-wall carbon nanotubes, it is effective to form heterojunctions of the metallic single-wall carbon nanotubes and the semiconductive single-wall carbon nanotubes by inducing a chirality change during the growth of single-wall carbon nanotubes and use the heterojunctions for channels. Whether the single-wall carbon nanotubes are metallic or semiconductive depends on a winding direction (chirality) of a graphene sheet that forms the single-wall carbon nanotubes. Thus, conversely, it is possible to control the single-wall carbon nanotubes to be metallic or semiconductive by controlling chiralities. Therefore, if a chirality change is induced during the growth of one single-wall carbon nanotube by introducing a defect during the growth of the single-wall carbon nanotubes and introducing a five-membered ring or a seven-membered ring in a six-membered ring structure of the graphene sheet, it is possible to realize a single-wall carbon nanotube heterojunction in which a semiconductive single-wall carbon nanotube and a metallic single-wall carbon nanotube are joined with each other in a longitudinal direction thereof. The inventors have produced a single-wall carbon nanotube FET, in which this single-wall carbon nanotube heterojunction is actually used for a channel, experimentally and confirmed that a large on/off ratio is obtained. However, the single-wall carbon nanotube in which the defect is introduced means, for example, a single-wall carbon nanotube in which a ratio of a G band intensity to a D band intensity is 1 to 20 in Raman spectroscopy performed by using an Ar ion laser having an oscillation wavelength of 532 nm.

According to an embodiment, there is provided a single-wall carbon nanotube heterojunction, wherein a semiconductive single-wall carbon nanotube and a metallic single-wall carbon nanotube are joined with each other in a longitudinal direction thereof.

In this single-wall carbon nanotube heterojunction, typically, the semiconductive single-wall carbon nanotube and the metallic single-wall carbon nanotube are joined with each other via a boundary (or a transition section) where chiralities change. This boundary is a kind of a defective section, in which a five-membered ring or a seven-membered ring is introduced in a six-membered ring structure of a graphene sheet.

According to another embodiment, there is provided a method of manufacturing a single-wall carbon nanotube heterojunction in which a semiconductive single-wall carbon nanotube and a metallic single-wall carbon nanotube are joined with each other in a longitudinal direction thereof, wherein a defect is introduced during the growth of a single-wall carbon nanotube to induce a chirality change.

Typically, the defect is introduced during the growth of the single-wall carbon nanotube to introduce a five-membered ring or a seven-membered ring into a six-membered ring structure of a graphene sheet to thereby induce a chirality change.

As a method of introducing the defect into the single-wall carbon nanotube, preferably, a method of growing the single-wall carbon nanotube at a temperature equal to or lower than 750° C., preferably, equal to or lower than 650° C. and preferably, equal to or higher than 400° C. according to the PECVD method for dissolving and activating a material gas using plasma (see, for example, Y. Li and H. Dai, et al, Nano Lett., 4, 2 (2004)317) is used. Besides, a method of periodically setting plasma in an on or off state in a process of the growth of a single-wall carbon nanotube according to the PECVD method or the thermal CVD method, a method of introducing an oxidative gas into a reaction chamber in a process of the growth of a single-wall carbon nanotube, a method of irradiating ultrasonic waves and light on a single-wall carbon nanotube instead of plasma, and the like may be used. The growth of the single-wall carbon nanotube is typically performed using a catalyst supported on a substrate and using a compound containing carbon as a material gas. As this catalyst, a catalyst publicly known in the past can be used. The catalyst may be supported on catalyst supporting particulates such as zeolite. As the substrate on which the catalysis is supported, preferably, a substrate, at least a surface of which is made of an oxide, is used. Specifically, for example, an Si substrate, a quartz substrate, a glass substrate, or the like, on a surface of which an SiO2 film is formed, is used. As the compound containing carbon as a material gas, various compounds of methane and the like can be used and selected according to necessity.

According to still another embodiment, there is provided a semiconductor device, wherein a single-wall carbon nanotube heterojunction in which a semiconductive single-wall carbon nanotube and a metallic single-wall carbon nanotube are joined with each other in a longitudinal direction thereof is used.

According to still another embodiment, there is provided a method of manufacturing a semiconductor device including the step of forming a single-wall carbon nanotube heterojunction in which a semiconductive single-wall carbon nanotube and a metallic single-wall carbon nanotube are joined with each other in a longitudinal direction thereof, wherein the single-wall carbon nanotube heterojunction is formed by introducing a defect during the growth of a single-wall carbon nanotube to induce a chirality change.

In the semiconductor device and the method of manufacturing the same according to an embodiment, plural single-wall carbon nanotube heterojunctions may be connected with one another in series or may be arranged in parallel with one another. The arrangement of the single-wall carbon nanotube heterojunctions is selected as appropriate according to a use, a function, and the like of the semiconductor device. The semiconductor device is typically an FET but is not limited to this. The semiconductor device may be other devices as long as the single-wall carbon nanotube heterojunction is used. In particular, when the semiconductor device is the FET, this single-wall carbon nanotube heterojunction is used for a channel. Typically, one or plural single-wall carbon nanotube heterojunctions are included in one or plural formed single-wall carbon nanotubes to bridge a source electrode and a drain electrode.

The description concerning the single-wall carbon nanotube heterojunction and the method of manufacturing the same applies to the semiconductor device and the method of manufacturing the same as long as the description is not against characteristics of the semiconductor device and the method of manufacturing the same.

According to an embodiment described above, in the single-wall carbon nanotube heterojunction in which the semiconductive single-wall carbon nanotube and the metallic single-wall carbon nanotube are joined with each other in the longitudinal direction thereof, it is possible not only to control conduction of the semiconductive single-wall carbon nanotube but also to control conduction of the single-wall carbon nanotube heterojunction by applying an external electric field thereto. By introducing the defect during the growth of the single-wall carbon nanotube to induce the chirality change, it is possible to grow the metallic single-wall carbon nanotube at the tip of the semiconductive single-wall carbon nanotube or grow the semiconductive single-wall carbon nanotube at the tip of the metallic single-wall carbon nanotube.

According to an embodiments, it is possible to easily realize the single-wall carbon nanotube heterojunction in which the semiconductive single-wall carbon nanotube and the metallic single-wall carbon nanotube are joined with each other in the longitudinal direction thereof. By using the single-wall carbon nanotube heterojunction for, for example, a channel of an FET, it is possible to control conduction of the channel by applying a gate voltage thereto and realize a single-wall carbon nanotube FET having a large on/off ratio and a satisfactory characteristic.

Additional features and advantages are described herein, and will be apparent from, the following Detailed Description and the figures.

DETAILED DESCRIPTION

The present application will be described below in greater detail according to an embodiment with reference to the accompanying drawings.

In an embodiment, a single-wall carbon nanotube FET in which a single-wall carbon nanotube heterojunction is used for a channel is explained.

Figure 1:
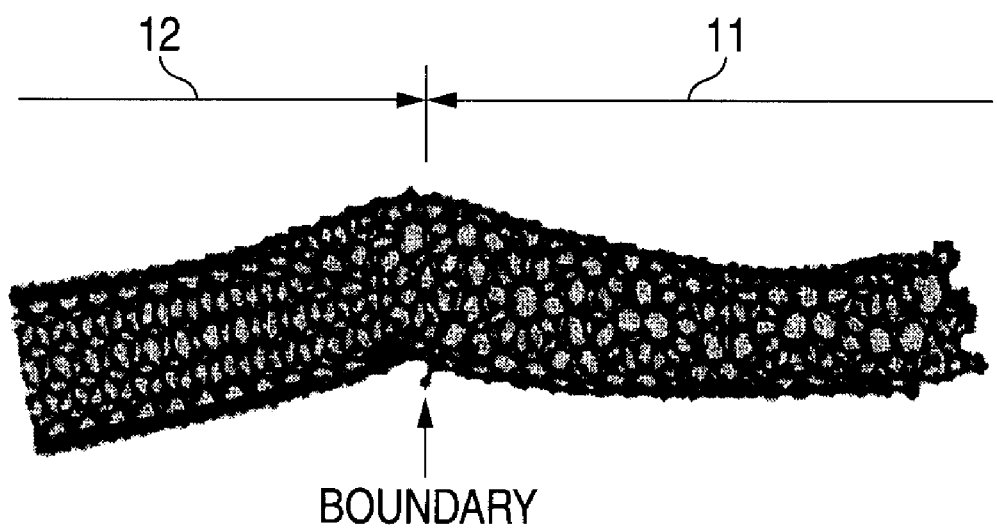
FIG. 1 is a schematic diagram showing a single-wall carbon nanotube heterojunction used in a first embodiment.

This single-wall carbon nanotube heterojunction is shown in FIG. 1.

As shown in FIG. 1, in this single-wall carbon nanotube heterojunction, a semiconductive single-wall carbon nanotube 11 and a metallic single-wall carbon nanotube 12 are joined with each other in a longitudinal direction thereof to constitute one single-wall carbon nanotube as a whole. The semiconductive single-wall carbon nanotube 11 and the metallic single-wall carbon nanotube 12 have chilarities different from each other. In a boundary of the single-wall carbon nanotubes, the chilarities change. Specifically, whereas both graphene sheets constituting the semiconductive single-wall carbon nanotube 11 and the metallic single-wall carbon nanotube 12 have a six-membered ring structure, a five-membered ring or a seven-membered ring is introduced in the six-membered ring structure in the boundary. Reflecting this chirality change, the semiconductive single-wall carbon nanotube 11 and the metallic single-wall carbon nanotube 12 are bent in the boundary.

Figure 2:
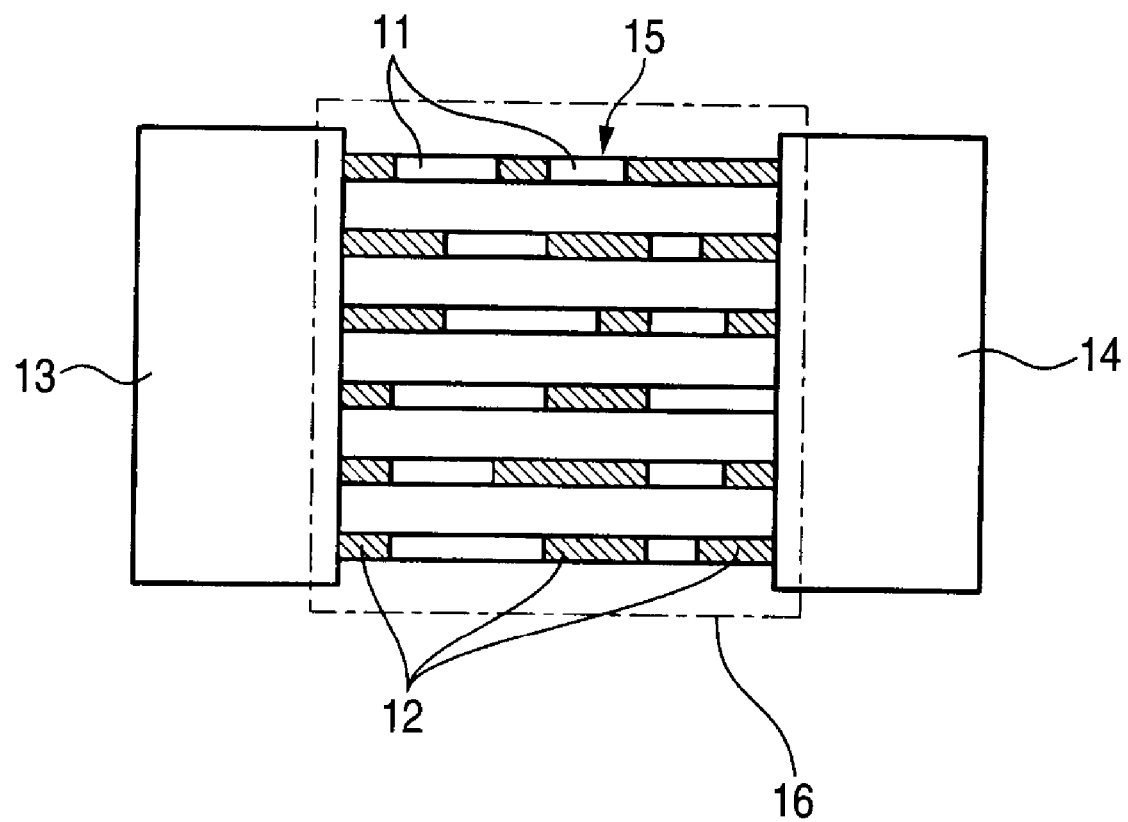
FIG. 2 is a plan view showing a single-wall carbon nanotube FET according to an embodiment.

A single-wall carbon nanotube FET in which this single-wall carbon nanotube heterojunction is used for a channel is shown in FIG. 2.

As shown in FIG. 2, in this single-wall carbon nanotube FET, a source electrode 13 and a drain electrode 14 are formed on a substrate (not shown), a surface of which is made of an oxide. As the substrate, an Si substrate on which an SiO2 film is formed, a quartz substrate, and the like can be used. Plural single-wall carbon nanotubes 15 including one or plural single-wall carbon nanotube heterojunctions in which the semiconductive single-wall carbon nanotubes 11 and the metallic single-wall carbon nanotubes 12 are joined with each other in the longitudinal direction thereof are formed to bridge the source electrode 13 and the drain electrode 14 (in FIG. 2, five single-wall carbon nanotubes 15 are formed). However, in FIG. 2, bends in the boundary of the semiconductive single-wall carbon nanotubes 11 and the metallic single-wall carbon nanotubes 12 are not shown.

When this single-wall carbon nanotube FET is a bottom gate type, a gate electrode 16 is formed on the substrate and a gate insulating film made of an SiO2 film or the like is formed on the gate electrode 16, and the single-wall carbon nanotubes 15 are formed on the gate insulating film. The gate electrode 16 may be formed on the rear surface of the substrate. On the other hand, when this single-wall carbon nanotube FET is a top gate type, a gate insulating film made of an SiO2 film or the like is formed on the single-wall carbon nanotubes 15 and the gate electrode 16 is formed on the gate insulating film. In these single-wall carbon nanotube FETs, the gate electrode 16 is formed to overlap all the semiconductive single-wall carbon nanotubes 11 included in the single-wall carbon nanotubes 15.

In the single-wall carbon nanotube FET constituted as described above, in a state in which a predetermined voltage is applied between the source electrode 13 and the drain electrode 14, a predetermined gate voltage is applied to the gate electrode 16, whereby channels are induced in all the semiconductive single-wall carbon nanotubes 11 to make the single-wall carbon nanotubes 15 conductive. This makes it possible to feed an electric current between the source electrode 13 and the drain electrode 14.

A method of manufacturing this single-wall carbon nanotube FET is explained below.

First, catalysts are arranged to be opposed to one another on a substrate, a surface of which is made of an oxide. This substrate with catalysts is placed in a reaction chamber (e.g., a quartz tube) of an PECVD device and the single-wall carbon nanotubes 15 are grown by the PECVD method with the catalysts as start points. In this case, a chirality change is induced during the growth of one single-wall carbon nanotube 15 by introducing a defect during the growth of the single-wall carbon-nanotubes 15 according to the selection of growth conditions and the like and introducing a five-membered ring or a seven-membered ring into a six-membered ring structure of the graphene sheet. A structure in which the semiconductive single-wall carbon nanotubes 11 and the metallic single-wall carbon nanotubes 12 are joined in the longitudinal direction thereof is formed. In this way, single-wall carbon nanotube heterojunctions are formed.

The source electrode 13 and the drain electrode 14 are formed to be electrically connected to both ends of the single-wall carbon nanotubes 15.

In the case of the top gate type FET, after a gate insulating film is formed on the single-wall carbon nanotubes 15, the gate electrode 16 is formed on the gate insulating film. In the case of the bottom gate type FET, the gate electrode 16 is formed in advance on a substrate before the growth of the single-wall carbon nanotube 15 and, after a gate insulating film is formed on the gate electrode 16, the single-wall carbon nanotubes 15 are grown on the gate insulating film. Alternatively, a gate insulating film is formed on a substrate, the single-wall carbon nanotubes 15 are grown on the gate insulating film, and the gate electrode 16 is formed on the rear surface of the substrate.

EXAMPLES

A single-wall carbon nanotube FET employing a single-wall carbon nanotube heterojunction was manufactured in accordance with a process shown in FIGS. 3A to 3E.

Figure 3:
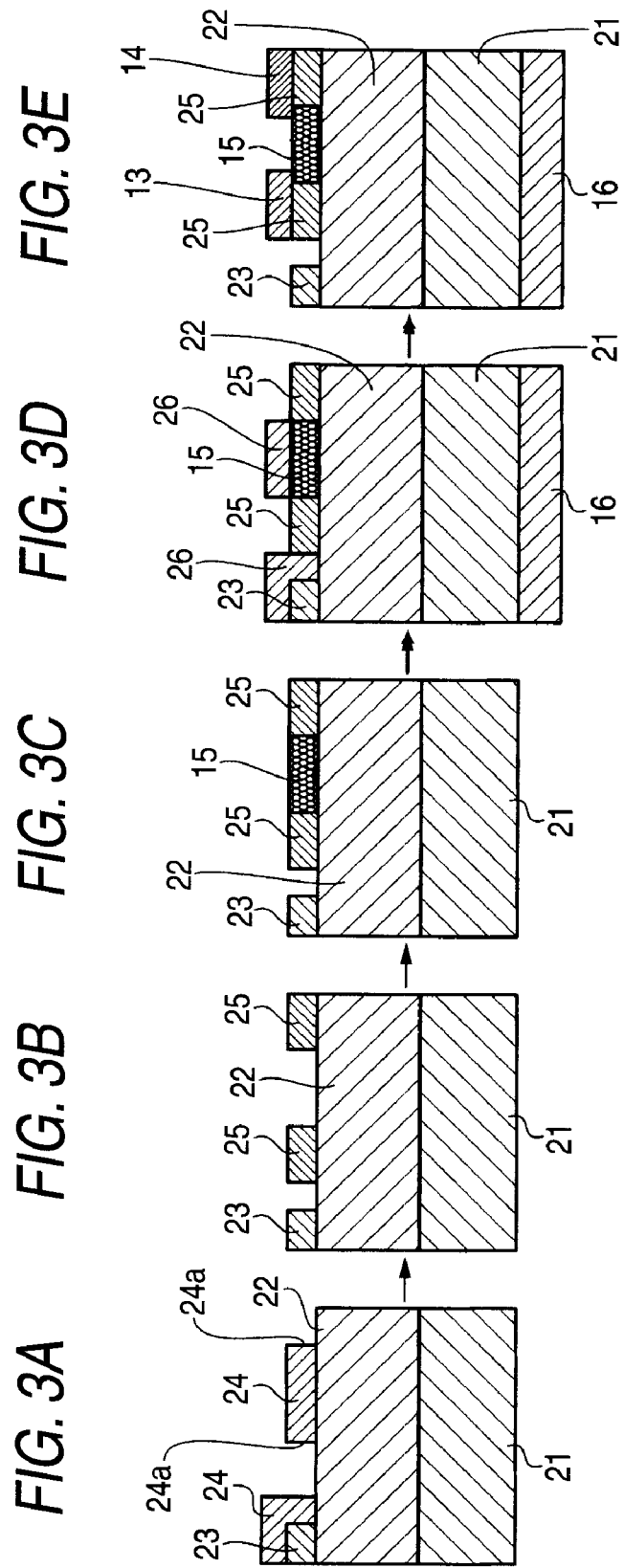
FIGS. 3A to 3E are sectional views for explaining a method of manufacturing a single-wall carbon nanotube FET according to an embodiment.

As shown in FIG. 3A, first, a p+ type Si substrate 21 on which an SiO2 film 22 having the thickness of 100 nm was formed was used as a substrate and an alignment mark 23 was formed on the SiO2 film 22. An electron beam resist was applied over the SiO2 film 22 according to the spin cost method at the number of revolutions of 5000 rpm. The thickness of this electron beam resist was 350 nm. The p+ type Si substrate 21 applied with the electron beam resist was placed on a hot plate and pre-baking of the electron beam resist was performed for three minutes at 200° C. The electron beam resist was rendered by an electro beam to render a pattern with a size of 4 μm×4 μm, which would be a catalyst forming area. As rendering conditions, an acceleration voltage was 5 kV, a magnification was 10000 times, a spot size was 58 nm, a rendering time was 1.3 s, and a dosage was 32 μC/cm2. The substrate on which the electron beam resist was formed was immersed in a developer and the electron beam resist was developed for 3.5 minutes at 22° C., whereby a resist pattern 24 having an opening 24a, which would be a catalyst forming area, was formed. Then, the substrate was subjected to rinse treatment for 10 seconds in a rinse liquid. Thereafter, the p+ type Si substrate 21 on which the resist pattern 24 was formed was placed on a hot plate and post-baking of the resist pattern 24 was performed for one minute at 200° C.

A zeolite supported catalyst solution was prepared, ultrasonic wave treatment was applied to the solution for one minute, and, then, one drop was dripped on the substrate. Thereafter, air seasoning of the substrate was performed. A catalyst was synthesized as follows. In 20 ml of ethanol, 1 g of Y type zeolite (a product name: HSZ-390HUA) was mixed and iron acetate and cobalt acetate were mixed at ratios of Fe: 2.5 wt % and Co: 2.5 wt %, respectively. After treating the ethanol mixed with the Y type zeolite, the iron acetate, and the cobalt acetate with ultrasonic waves for 10 minutes, the ethanol was dried for 24 hours at 80° C. and ethanol was added 10 ml. The resist pattern 24 was lifted off using diethylene glycol diethyl ether as a lift-off solution. In this way, as shown in FIG. 3B, zeolite supported catalysts 25 were formed to be opposed to each other in positions where openings 24a of the resist pattern 24 were located.

Figure 4:
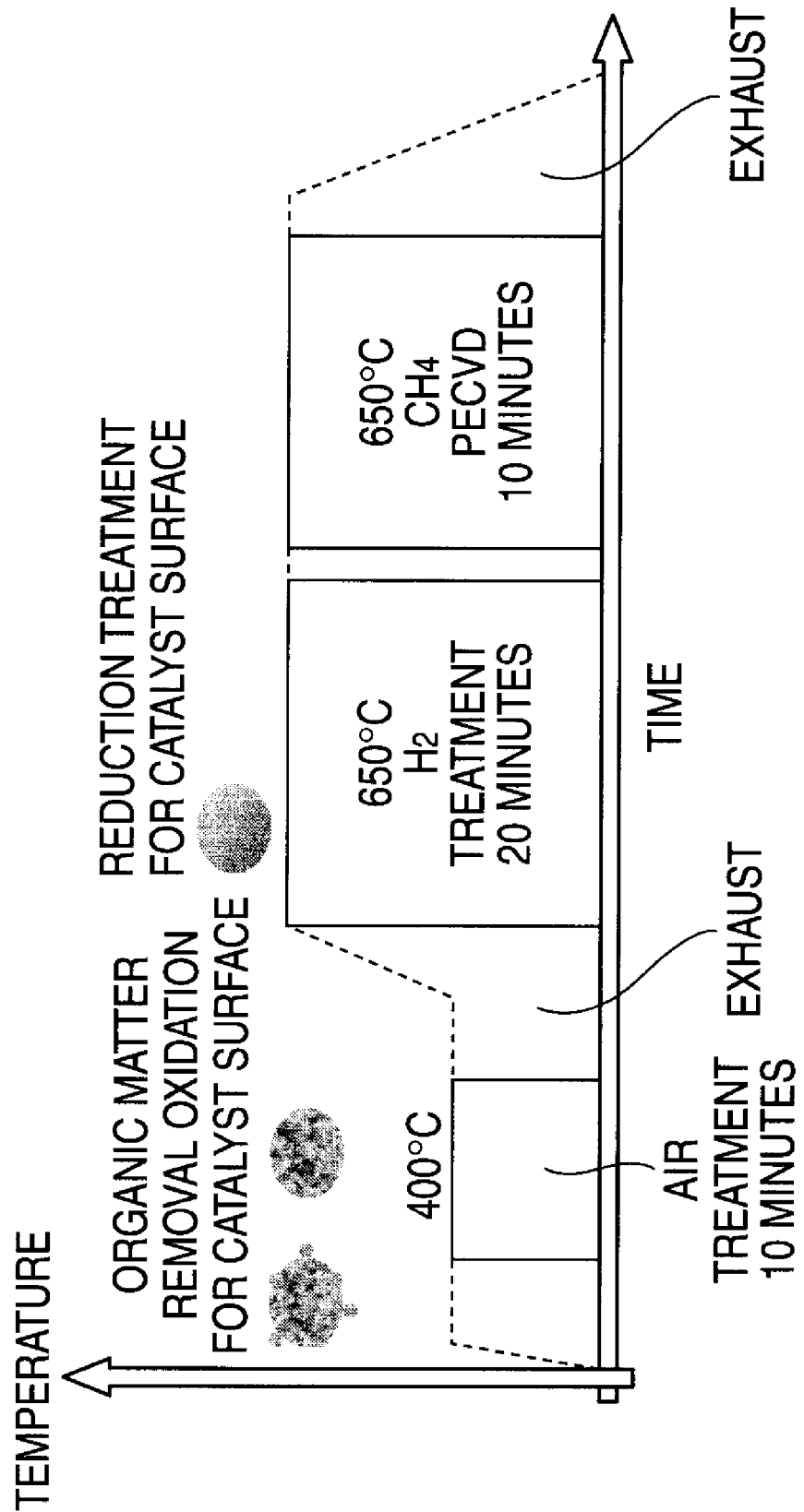
FIG. 4 is a schematic diagram showing a temperature-time change during synthesizing of a single-wall carbon nanotube according to an embodiment.

As shown in FIG. 3C, the single-wall carbon nanotube 15 including the single-wall carbon nanotube heterojunction was grown using the zeolite supported catalysts 25. Specifically, the single-wall carbon nanotube 15 was grown as follows. A temperature-time change during synthesizing of the single-wall carbon nanotube 15 is shown in FIG. 4. First, p+ type Si substrate 21 on which the zeolite supported catalysts 25 were arranged was set in the center of a quartz tube of the PECVD device. The p+ type Si substrate 21 was heated to raise a substrate temperature to 400° C. in 20 minutes. Then, the p+ type Si substrate 21 was held at 400° C. for 10 minutes and heated to remove deposits on the surfaces of the zeolite supported catalysts 25. Thereafter, the heating of the p+ type Si substrate 21 was stopped.

After the temperature in the quartz tube fell to 200° C., the air was exhausted from the quarts tube until the pressure in the quartz tube fell to 2 Pa. Subsequently, an H2 gas was fed into the quartz tube at a flow rate of 60 sccm to raise the temperature in the quartz pipe to 650° C. and maintain the pressure in the quartz pipe at 600 Pa. The surface of the zeolite supported catalyst 25 was subjected to reduction treatment and cleaned.

The temperature in the quartz pipe was maintained at 650° C. and the pressure in the quartz pipe was maintained at 600 Pa for 20 minutes to change the zeolite supported catalysts 25 to particulates.

A plasma power supply was turned on. Plasma power at this point was fixed to 75 W.

A CH4 gas was fed into the quartz pipe at a flow rate of 40 sccm to set the pressure in the quartz pipe to 60 Pa and the growth was performed for 10 minutes. According to the growth, as shown in FIG. 3C, the single-wall carbon nanotube 15 was grown to bridge the zeolite supported catalysts 25.

Thereafter, the heating of the quartz pipe was stopped and the plasma power supply was turned off.

As shown in FIG. 3D, the gate electrode 16 made of Al was formed on the rear surface of the p+ type Si substrate 21. In the same manner as the formation of the resist pattern 24 used for the patterning of the zeolite supported catalysts 25, a resist pattern 26 for formation of a source electrode and a drain electrode was formed. After a Ti film having the thickness of 2 nm and a Pd film having the thickness of 100 nm were sequentially vacuum-evaporated over the entire surface of the substrate at a film formation speed of 0.03 nm/s, the resist pattern 26 was removed (lift off). In this way, as shown in FIG. 3E, the source electrode 13 and the drain electrode 14 were formed. A channel width was 10 μm and a channel length was 0.5 μm. As the lift-off solution, diethylene glycol diethyl ether was used.

Figure 5:
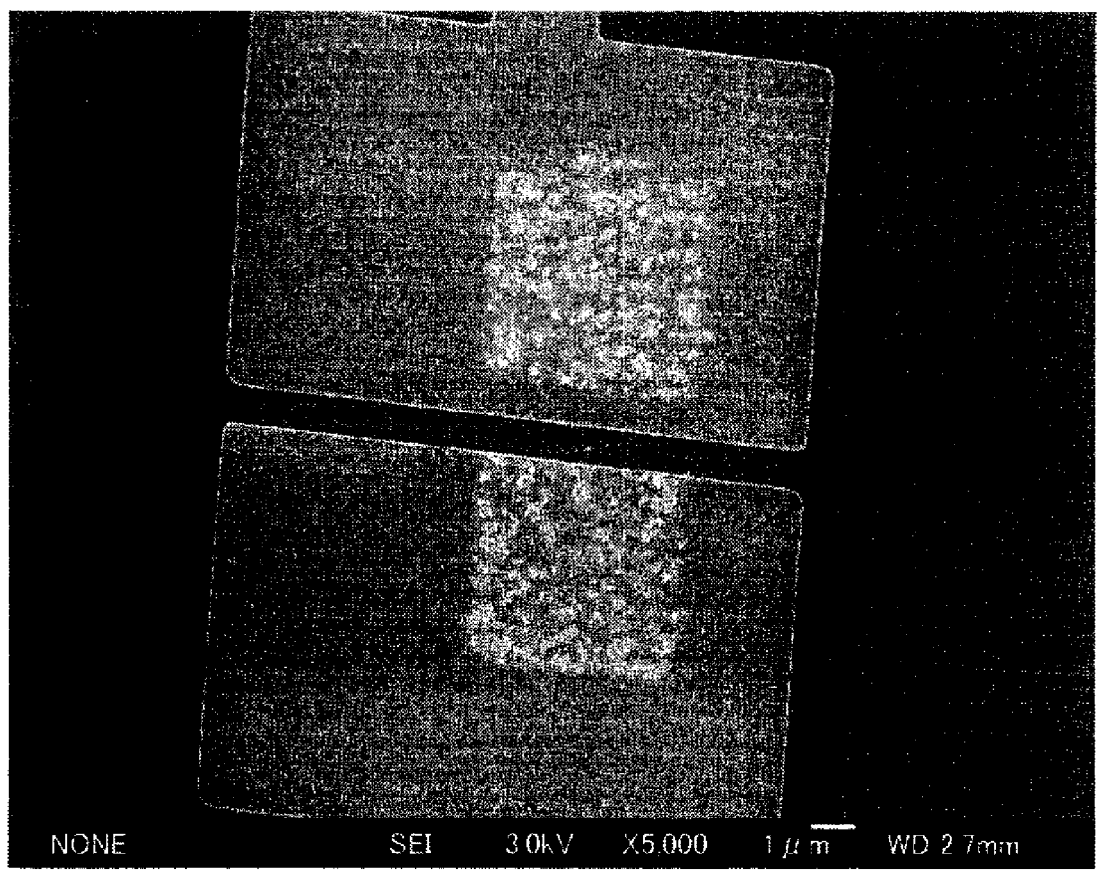
FIG. 5 is a photograph substituted for a drawing showing an SEM image of a single-wall carbon nanotube FET obtained by the method of manufacturing a single-wall carbon nanotube FET according to an embodiment.

As described above, the single-wall carbon nanotube FET employing the single-wall carbon nanotube heterojunction was manufactured. A result obtained by observing the single-wall carbon nanotube FET obtained in this way with a scanning electron microscope (SEM) is shown in FIG. 5.

For a structure analysis of the single-wall carbon nanotube 15 obtained by performing growth for 10 minutes at 650° C. according to the PECVD method as described above, a Raman spectroscopic analysis and analyses by a transmission electron microscope (TEM) and a scanning electron microscope (SEM) were performed. Results of the analyses are explained below.

Figure 6:
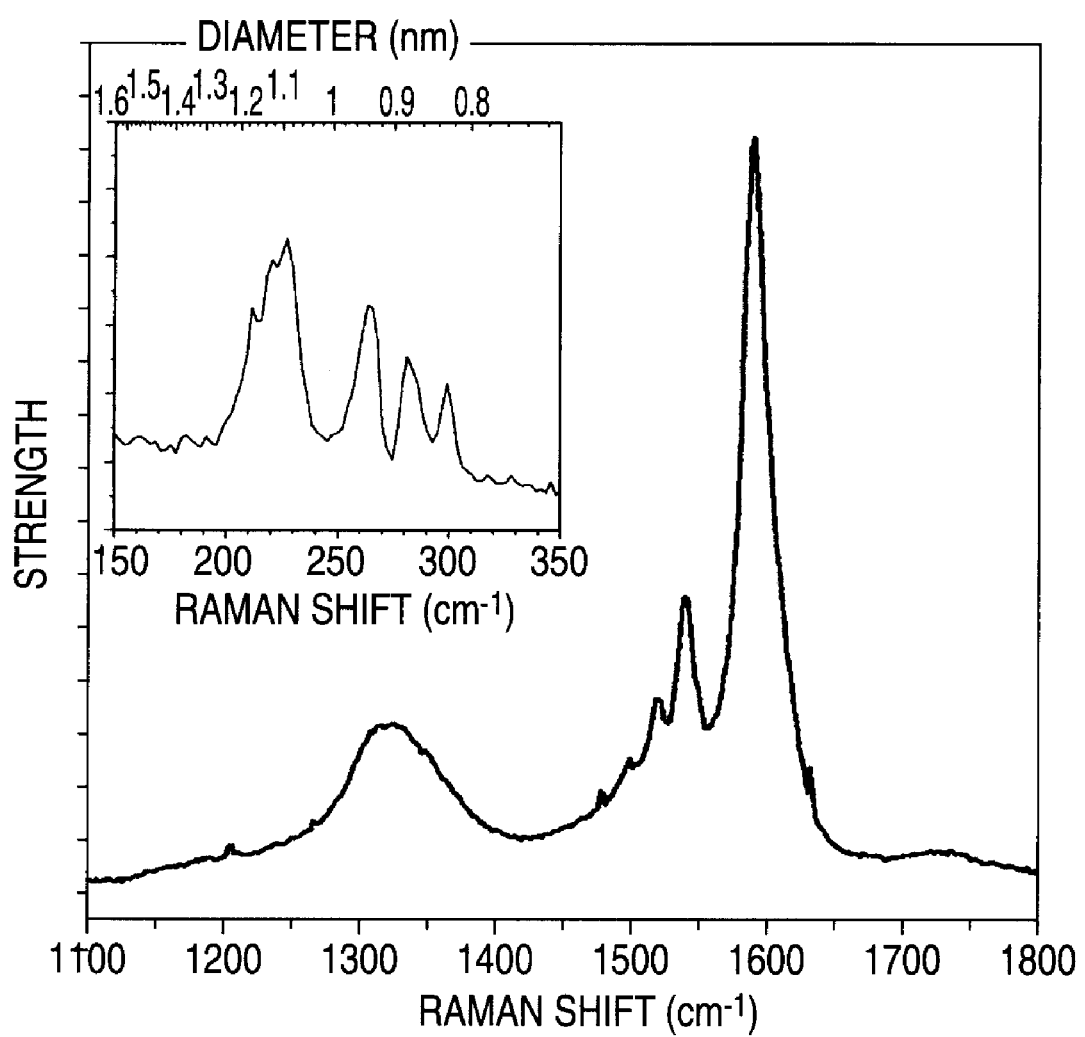
FIG. 6 is a graph showing a result of a Raman spectroscopic analysis for the single-wall carbon nanotube synthesized according to an embodiment.

FIG. 6 shows a result of the Raman spectroscopic analysis. As shown in FIG. 6, a ratio of a G band derived from a graphene crystal structure near 1600 cm-1 to a D band derived from a disordered structure near 1350 cm-1 (a G/D ratio) was 4.5. When a single-wall carbon nanotube is synthesized by the CVD method under a high-temperature condition near 650 to 850° C., a single-wall carbon nanotube with the G/D ratio of 20 to 100 and high crystallinity is synthesized because of a reduction in generation of amorphous carbon, a reduction in introduction of a defect into a wall surface of the single-wall carbon nanotube, and the like. On the other hand, in this example, a growth speed of the single-wall carbon nanotube 15 was facilitated compared with the thermal CVD method because the PECVD method was used. However, since a synthesizing temperature was low at 650° C., a defect was introduced in a tube wall surface in a process in which the single-wall carbon nanotube 15 grew from the zeolite supported catalysts 25.

Figure 7B:
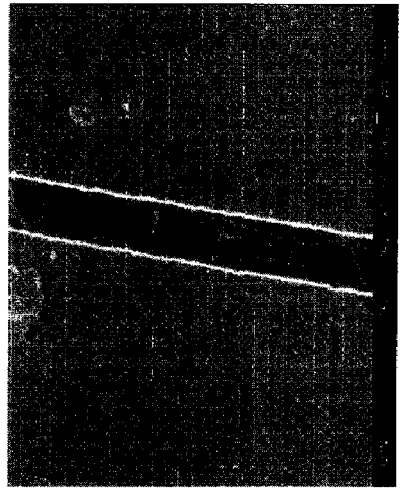
FIGS. 7A to 7D are photographs substituted for drawings showing SEM images near channel sections of the single-wall carbon nanotube FET obtained by the method of manufacturing a single-wall carbon nanotube FET according to the example and a single-wall carbon nanotube FET obtained by a method of manufacturing a single-wall carbon nanotube FET according to a comparative example.
Figure 7D:
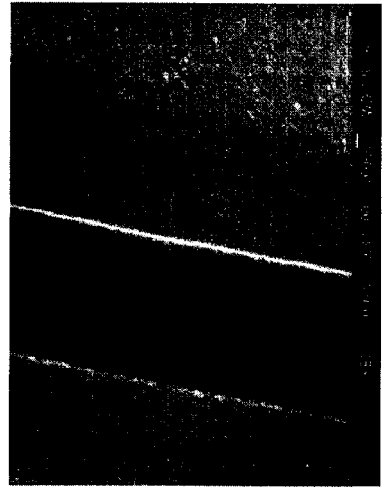
Figure 7A:
Figure 7C:

SEM images of the single-wall carbon nanotube 15 that bridges the source electrode 13 and the drain electrode 14 of the manufactured single-wall carbon nanotube FET are shown in FIGS. 7A and 7B. On the other hand, as a comparative example, the SiO2 film 22 having the thickness of 100 nm was formed on the p+ type Si substrate 21, a zeolite catalyst was dispersedly applied over the SiO2 film 22, and a single-wall carbon nanotube was grown from this zeolite catalyst for 30 minutes at 850° C. according to the thermal CVD method using a CH4 gas. FIGS. 7C and 7D show SEM images of the single-wall carbon nanotube of the comparative example grown in this way.

As shown in FIGS. 7A and 7B, in the SEM images of the single-wall carbon nanotube 15 synthesized at 650° C. according to the PECVD method, compared with the SEM images of the single-wall carbon nanotube synthesized at 850° C. according to the thermal CVD method shown in FIGS. 7C and 7D, there are many portions where the tube is suddenly bent. Thus, this single-wall carbon nanotube 15 is considered to have a high defect density. Further, since an outline of a secondary electron image of the single-wall carbon nanotube 15 is disordered, it is considered that the adhesion of the SiO2 film 22 and the tube wall of the single-wall carbon nanotube 15 is not uniform or an electron conductivity in the tube changes depending on a place.

Seventy-five single-wall carbon nanotube FETS were manufactured according to the method of the example. Operations of fifty single-wall carbon nanotube FETs without a leak and a position error among the seventy-five single-wall carbon nanotube FETs were measured. As a result, sixteen single-wall carbon nanotube FETs out of the fifty single-wall carbon nanotube FETs show an on/off ratio of two or more digits. This is 30% of the fifty single-wall carbon nanotube FETs. Measurement results are shown in Table 1. In these single-wall carbon nanotube FETs, the electrical breakdown and the chemical treatment for removal of a metallic single-wall carbon nanotube, which are used in the single-wall carbon nanotube FET in the past, are not used.

TABLE 1

| Total measured devices | Leak devices | Positioning error | Without leak and positioning error | On/off ratio | Operation percentage (two or more digits) |
|---|---|---|---|---|---|
| 75 | 8 | 17 | 50 | >2  >3<br>16  11 | 32% |

* Without electrical breakdown and chemical treatment

Figure 8A:
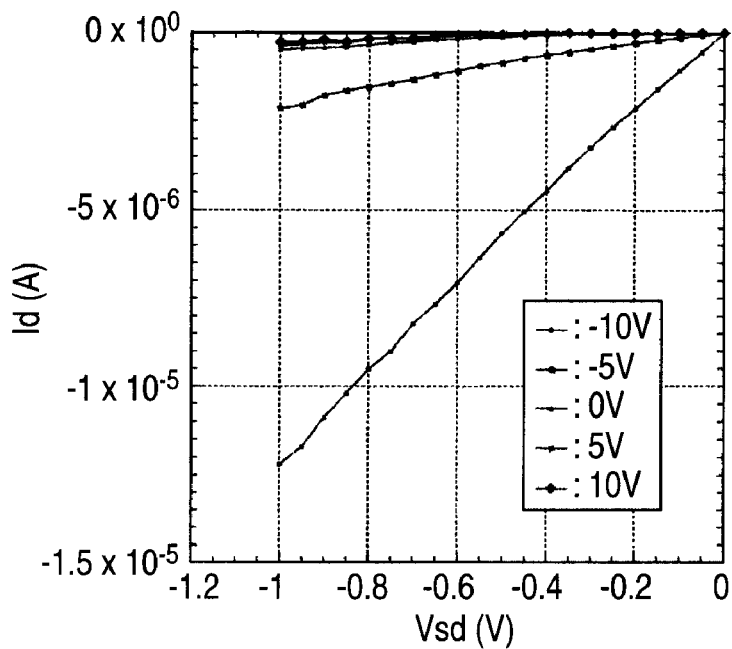
FIGS. 8A and 8B are graphs showing a $V_{sd}$-$I_d$ characteristic and a $V_g$-$I_d$ characteristic of the single-wall carbon nanotube FET obtained by the method of manufacturing a single-wall carbon nanotube FET according to an embodiment.
Figure 8B:
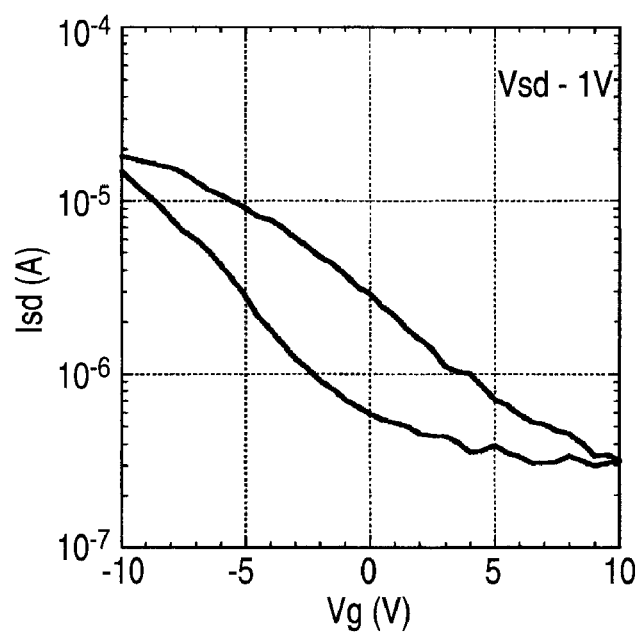

Results obtained by measuring a source-to-drain voltage (Vsd)—drain current (Id) characteristic and a gate voltage (Vg)—drain current (Id) characteristic of an arbitrary single-wall carbon nanotube FET indicating an operation percentage of the on/off ratio of two or more digits are shown in FIGS. 8A and 8B. In FIGS. 8A and 8B, an on-state current at Vg=−10V of the single-wall carbon nanotube FET, in which the single-wall carbon nanotube 15 is synthesized according to the PECVD method, show a value in the order of 10-5 A. This is a value one digit higher than the order of 10-6 A of an on-state current of the single-wall carbon nanotube FET, in which the single-wall carbon nanotube is synthesized at 650° C. according to the thermal CVD method.

As described above, in the single-wall carbon nanotube FET according to this example, the removal of the metallic single-wall carbon nanotube by an overcurrent was not performed. Nevertheless, as shown in Table 1 and FIGS. 8A and 8B, the on/off ratio of about two digits and the on-state current of about 10 μA were obtained. A cause of this is as explained below.

Since the single-wall carbon nanotube 15 that bridges the source electrode 13 and the drain electrode 14 is synthesized at a low temperature of 650° C., a defect is introduced into a crystal structure during the growth. Consequently, a chirality change is induced. As a result, as shown in FIG. 1, the semiconductive single-wall carbon nanotube 11 and the metallic single-wall carbon nanotube 12 are formed in the identical single-wall carbon nanotube 15 and a single-wall carbon nanotube heterojunction in which the semiconductive single-wall carbon nanotube 11 and the metallic single-wall carbon nanotube 12 are joined with each other in the longitudinal direction is formed. In other words, since the single-wall carbon nanotube 15 that bridges the source electrode 13 and the drain electrode 14 includes the single-wall carbon nanotube heterojunction, when this single-wall carbon nanotube FET is actuated, it is considered that a field effect characteristic derived from the semiconductive single-wall carbon nanotube 11 is observed as the high on/off characteristic shown in FIGS. 8A and 8B.

As described above, according to an embodiment, the single-wall carbon nanotube 15 is grown at a low temperature according to the PECVD method to introduce a defect during the growth and induce a chirality change. This makes it possible to form the single-wall carbon nanotube heterojunction in which the semiconductive single-wall carbon nanotube 11 and the metallic single-wall carbon nanotube 12 are joined in the longitudinal direction thereof. By manufacturing an FET using the single-wall carbon nanotube heterojunction for a channel, it is possible to realize a single-wall carbon nanotube FET having an on/off ratio of two or more digits and a satisfactory characteristic. Since the electrical breakdown and the chemical treatment for removal of the metallic single-wall carbon nanotube do not have to be used, it is easy to manufacture the single-wall carbon nanotube FET.

It should be appreciated that a variety of different modifications based on the technical idea of the present application are possible. Electric, mechanical, and optical characteristics of a carbon nanotube and control of these characteristics are not limited to the above description.

For example, the numerical values, the structures, the arrangements, the shapes, the materials, the raw materials, the processes, and the like described in the embodiment and the example are merely examples. Numerical values, structures, arrangements, shapes, materials, raw materials, processes, and the like different from the above may be used when necessary.

Specifically, for example, in the single-wall carbon nanotube FET according to the embodiment, if a transparent substrate is used as the substrate and the source electrode 13, the drain electrode 14, and the gate electrode 16 are formed by the single-wall carbon nanotube, it is possible to realize a transparent single-wall carbon nanotube FET.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A single-wall carbon nanotube heterojunction comprising a semiconductive single-wall carbon nanotube and a metallic single-wall carbon nanotube that are joined via a growth defect with each other in a longitudinal direction thereof and wherein the single-wall carbon nanotube includes a ratio of a G band intensity to a D band intensity ranging from 1 to 20 in Raman spectroscopy performed by using an Ar ion laser having an oscillation wavelength of 532 nm.

2. A single-wall carbon nanotube heterojunction according to claim 1, wherein the semiconductive single-wall carbon nanotube and the metallic single-wall carbon nanotube are joined with each other via a boundary where chiralities change.

3. A method of manufacturing a single-wall carbon nanotube heterojunction comprising joining a semiconductive single-wall carbon nanotube and a metallic single-wall carbon nanotube via a growth defect with each other in a longitudinal direction thereof, wherein the defect introduced during growth of the single-wall carbon nanotube introduces a five-membered ring or a seven-membered ring into a six-membered ring structure of a graphene sheet thereby to induce a chirality change.

4. A method of manufacturing a single-wall carbon nanotube heterojunction according to claim 3, wherein the growth of the single-wall carbon nanotube is performed at a temperature equal to or higher than 400° C. and equal to or lower than 750° C. according to a plasma enhanced chemical vapor deposition method.

5. A semiconductor device, comprising a single-wall carbon nanotube heterojunction in which a semiconductive single-wall carbon nanotube and a metallic single-wall carbon nanotube are joined via a growth defect with each other in a longitudinal direction thereof is used and wherein the single-wall carbon nanotube includes a ratio of a G band intensity to a D band intensity ranging from 1 to 20 in Raman spectroscopy performed by using an Ar ion laser having an oscillation wavelength of 532 nm.

6. A method of manufacturing a semiconductor device comprising:

forming a single-wall carbon nanotube heterojunction in which a semiconductive single-wall carbon nanotube and a metallic single-wall carbon nanotube are joined via a growth defect with each other in a longitudinal direction thereof, wherein the single-wall carbon nanotube heterojunction is formed by introducing the defect during growth of a single-wall carbon nanotube to introduce a five-membered ring or a seven-membered ring into a six-membered ring structure of a graphene sheet thereby to induce a chirality change.

* * * * *